(12) United States Patent
    Kim et al.

(10) Patent No.: US 11,418,378 B2
(45) Date of Patent: Aug. 16, 2022

(54) METHOD OF ADJUSTING APPLIED VOLTAGE FOR TRANSMISSION SIGNAL AMPLIFICATION AND ELECTRONIC DEVICE THEREOF

(71) Applicant: Samsung Electronics Co., Ltd., Gyeonggi-do (KR)

(72) Inventors: Woojin Kim, Gyeonggi-do (KR); Junghwan Son, Gyeonggi-do (KR); Youngmin Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/225,478

(22) Filed: Apr. 8, 2021

(65) Prior Publication Data

US 2021/0320829 A1    Oct. 14, 2021

(30) Foreign Application Priority Data

Apr. 8, 2020  (KR) .................. 10-2020-0043006

(51) Int. Cl.
    *H04L 27/26*    (2006.01)
    *H04L 1/00*    (2006.01)
    (Continued)

(52) U.S. Cl.
    CPC .......... *H04L 27/2614* (2013.01); *H03F 1/02* (2013.01); *H03F 3/20* (2013.01); *H04B 1/04* (2013.01);
    (Continued)

(58) Field of Classification Search
    CPC ............. H03F 1/0211; H03F 2200/18; H03F 2200/451; H03F 2200/504;
    (Continued)

(56) References Cited

U.S. PATENT DOCUMENTS 9,197,162 B2    11/2015 Chiron et al.
9,425,744 B2    8/2016 Yang et al.
(Continued)

FOREIGN PATENT DOCUMENTS

JP    2004-320446    11/2004
JP    2004-356729    12/2004
(Continued)

OTHER PUBLICATIONS

International Search Report dated Jul. 23, 2021 issued in counterpart application No. PCT/KR2021/004442, 8 pages.

*Primary Examiner* — David S Huang
(74) *Attorney, Agent, or Firm* — The Farrell Law Firm, P.C.

(57) ABSTRACT

According to one or more embodiments of the disclosure, an electronic device may include a power amplifier, a voltage generator, an antenna, and a communication processor. The CP determines whether an output waveform of the transmission signal which is output through the antenna is a first waveform or a second waveform. If the output waveform is the first waveform, the voltage generator generates a first output voltage for amplifying the first waveform by applying a first direct current (DC) power source of one or more first voltages. If the output waveform is the second waveform, the voltage generator generates a second output voltage for amplifying the second waveform by applying a second DC power source of a second voltage shifted by a designated level with respect to the first voltage, based on a peak power of the first waveform and a peak power of the second waveform.

20 Claims, 10 Drawing Sheets

(51) Int. Cl.
*H04B 1/04* (2006.01)
*H04W 52/30* (2009.01)
*H03F 3/20* (2006.01)
*H03F 1/02* (2006.01)

(52) U.S. Cl.
CPC ............ *H04L 1/0003* (2013.01); *H04W 52/30* (2013.01); *H04B 2001/0416* (2013.01)

(58) Field of Classification Search
CPC .... H04B 2001/0408; H04B 2001/0416; H04B 2001/0425
See application file for complete search history.

(56) References Cited

U.S. PATENT DOCUMENTS

| | | |
|---|---|---|
| 10,630,247 B2 | 4/2020 | Jo et al. |
| 10,680,559 B2 | 6/2020 | Khlat et al. |
| 2008/0171523 A1* | 7/2008 | Anderson ............ H03F 1/0205 330/136 |
| 2012/0088510 A1 | 4/2012 | Akhi et al. |
| 2012/0108187 A1* | 5/2012 | Kitamura ................ H03F 1/32 455/110 |

FOREIGN PATENT DOCUMENTS

| | | |
|---|---|---|
| KR | 1020010038112 | 5/2001 |
| KR | 10-1467231 | 12/2014 |
| KR | 10-1947533 | 2/2019 |

* cited by examiner

METHOD OF ADJUSTING APPLIED VOLTAGE FOR TRANSMISSION SIGNAL AMPLIFICATION AND ELECTRONIC DEVICE THEREOF

CROSS-REFERENCE TO RELATED APPLICATION(S)

This application is based on and claims priority under 35 U.S.C. § 119 to Korean Patent Application No. 10-2020-0043006, which was filed in the Korean Intellectual Property Office on Apr. 8, 2020, the entire disclosure of which is incorporated herein by reference.

BACKGROUND

1. Field of the Disclosure

The disclosure relates generally to a method of adjusting an applied voltage for transmission signal amplification, and an electronic device thereof.

2. Related Art

With the growing advancement of electronic devices, various modules and functions are supported. For example, electronic devices additionally support large-volume file downloads, multi-windows, large screens, dual speakers, and/or multi-cameras. Electronic devices may also apply a next-generation communication method, which is a faster communication method, in order to support additional functionality.

In 5th Generation (5G) systems, discrete Fourier transform spread orthogonal frequency division multiplexing (DFT-s-OFDM) and cyclic prefix OFDM (CP-OFDM) are managed in uplink (UL) communication. In addition, various modulation schemes are applied for a UL communication signal in 5G. However, current consumption may increase when a voltage for transmission signal amplification is equally applied, based on the different waveforms and/or different modulation schemes.

SUMMARY

This disclosure is provided to address at least the problems and/or disadvantages described above and to provide at least the advantages described below.

Accordingly, an aspect of the disclosure is to provide a method of adjusting an applied voltage for transmission signal amplification and an electronic device thereof, in order to decrease current consumption by adaptively adjusting a management of the applied voltage for signal amplification, based on different waveforms and/or modulation schemes.

Another aspect of the disclosure is to provide a method of adaptively adjusting an applied voltage for transmission signal amplification, in accordance with an instantaneous power and/or signal quality of a transmission signal.

In accordance with an aspect of the disclosure, an electronic device is provided, which includes a power amplifier (PA) configured to amplify an input signal; a voltage generator configured to generate one or more output voltages to be applied to the PA to amplify the input signal; an antenna configured to output a transmission signal, based on a signal amplified by the PA; and a communication processor (CP) configured to control the PA, the voltage generator, and the antenna. The CP is configured to determine whether an output waveform of the transmission signal output through the antenna is a first waveform or a second waveform, if the output waveform is the first waveform, control the voltage generator to generate a first output voltage for amplifying the first waveform by applying a first direct current (DC) power source of one or more first voltages, and if the output waveform is the second waveform, control the voltage generator to generate a second output voltage for amplifying the second waveform by applying a second DC power source of a second voltage shifted by a designated level with respect to the first voltage, based on a peak power of the first waveform and a peak power of the second waveform.

In accordance with another aspect of the disclosure, an electronic device is provided, which includes a power amplifier (PA) configured to amplify an input signal; a voltage generator configured to generate one or more output voltages to be applied to the PA to amplify the input signal; an antenna configured to output a transmission signal, based on a signal amplified by the PA; and a communication processor (CP) configured to control the PA, the voltage generator, and the antenna. The CP is configured to determine a modulation scheme of the transmission signal output through the antenna, if the modulation scheme is a reference modulation scheme, control the voltage generator to generate a reference output voltage for amplifying the input signal by applying a reference direct current (DC) power source of one or more reference voltage, and if the modulation scheme is not the reference modulation scheme, control the voltage generator to generate an output voltage for amplifying the input signal by applying a DC power source of a voltage shifted by a designated level, based on a peak power of the modulation scheme and a peak power of the reference modulation scheme.

In accordance with another aspect of the disclosure, a method is provided for controlling an electronic device. The method includes determining whether an output waveform of a transmission signal output through an antenna of the electronic device is a first waveform or a second waveform; if the output waveform is the first waveform, generating a first output voltage for amplifying an input signal of a power amplifier (PA) of the electronic device, by using a first direct current (DC) power source of one or more first voltages; and if the output waveform is the second waveform, generating a second output voltage for amplifying the second waveform by using a second DC power source of a second voltage shifted by a designated level with respect to the first voltage, based on a peak power of the first waveform and a peak power of the second waveform.

BRIEF DESCRIPTION OF DRAWINGS

The above and other aspects, features, and advantages of certain embodiments of the disclosure will be more apparent from the following detailed description taken in conjunction with the accompanying drawings, in which.

DETAILED DESCRIPTION

Hereinafter, various embodiments of the disclosure will be described in detail with reference to the accompanying drawings.

In the following description, specific details such as detailed configuration and components are provided to assist the overall understanding of these embodiments of the disclosure. Therefore, it should be apparent to those skilled in the art that various changes and modifications of the embodiments described herein can be made without departing from the scope and spirit of the disclosure. In addition, descriptions of well-known functions and constructions are omitted for clarity and conciseness.

Figure 1:
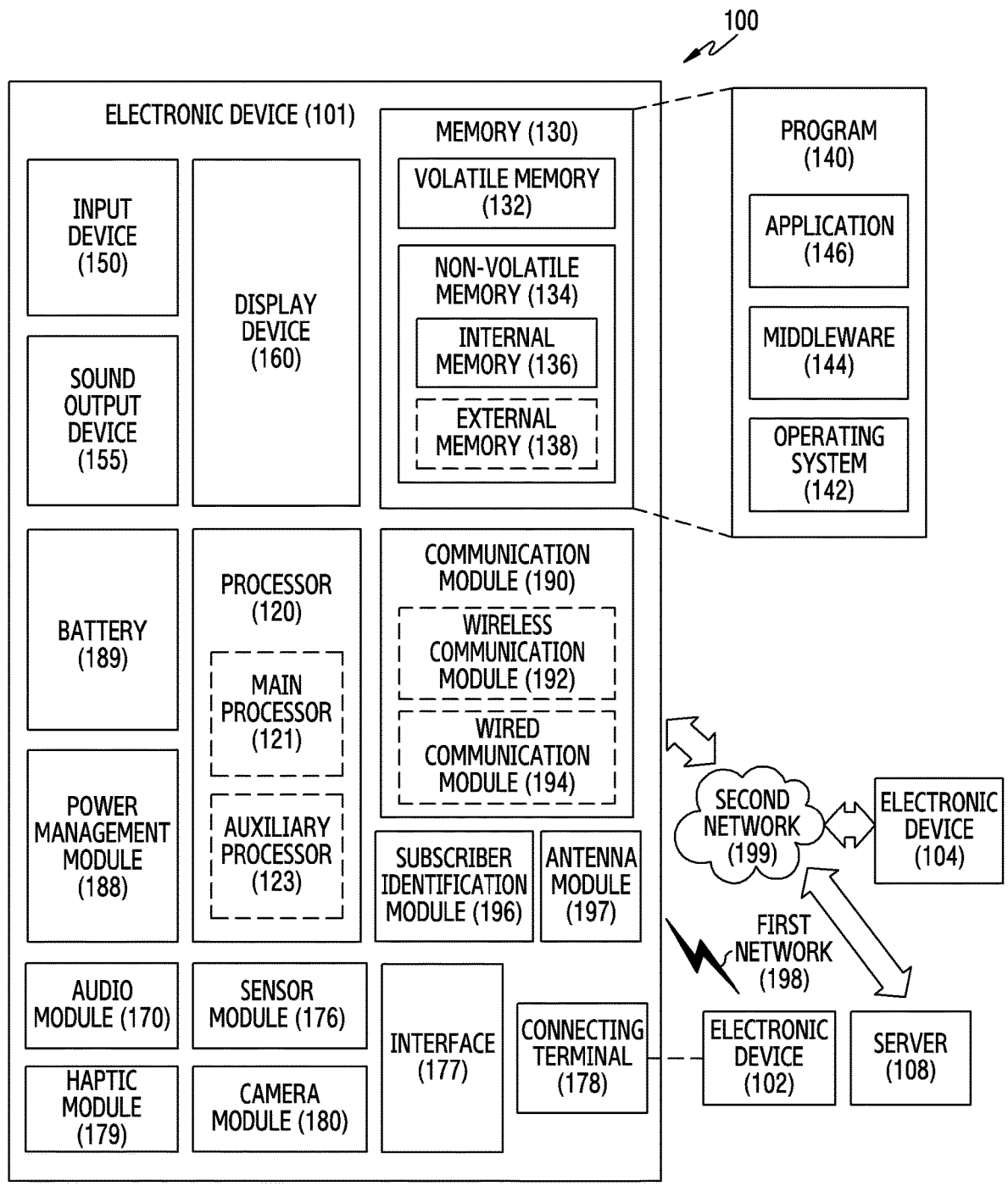
FIG. 1 illustrates an electronic device in a network environment according to an embodiment.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

According to an embodiment, the auxiliary processor 123 (e.g., the NPU) may include a hardware structure specified for artificial intelligence (AI) model processing. An AI model may be generated by machine learning. Such learning may be performed, e.g., by the electronic device 101 where the AI is performed or via a separate server (e.g., the server 108). Learning algorithms may include, but are not limited to, e.g., supervised learning, unsupervised learning, semi-supervised learning, or reinforcement learning. The AI model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent DNN (BRDNN), deep Q-network or a combination of two or more thereof, but is not limited thereto. The AI model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving an incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and UL, or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a PCB, an RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of, the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

In the structure of the electronic device 101 described with reference to FIG. 1, the communication module 190 may include various hardware components for performing communication. For example, the communication module 190 may include components as illustrated in FIG. 2, which is described below.

Figure 2:
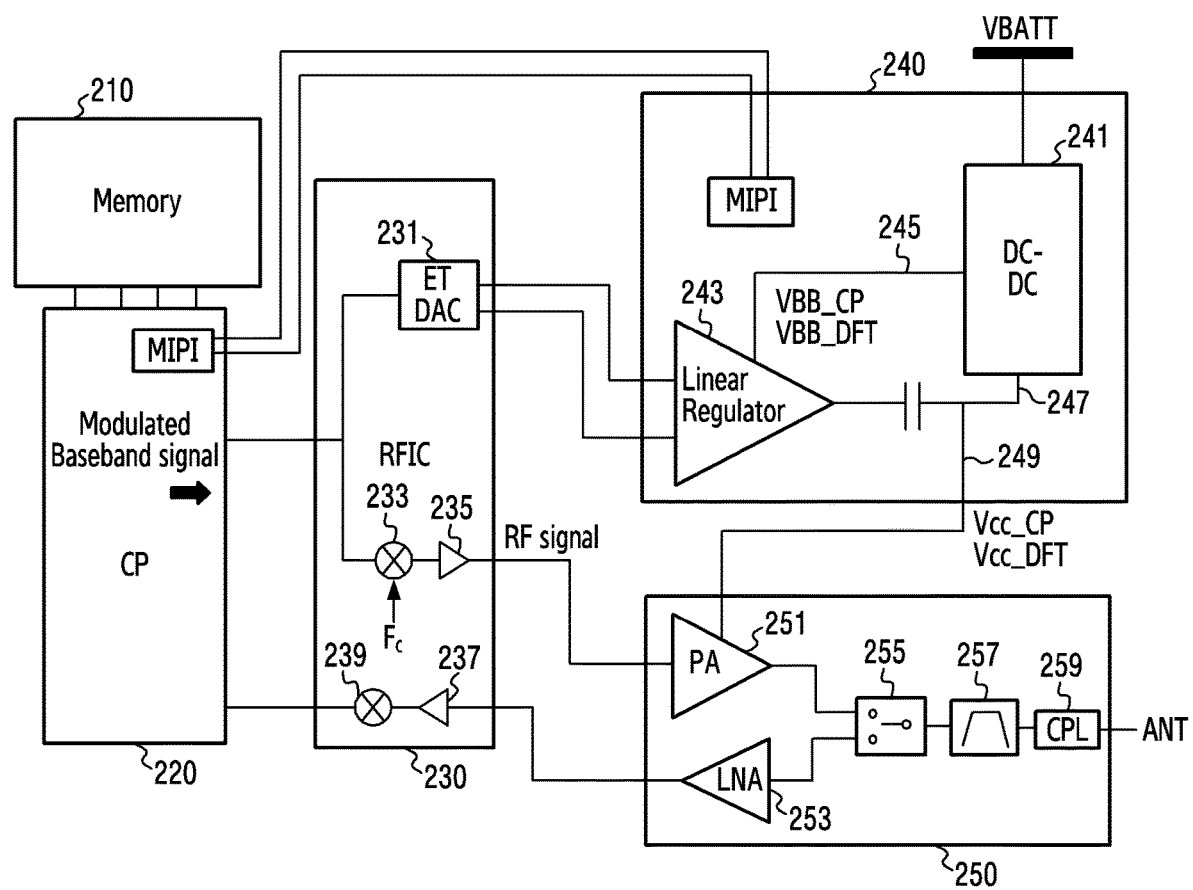
FIG. 2 illustrates a communication module in an electronic device according to an embodiment.

FIG. 2 illustrates a communication module in an electronic device according to an embodiment.

Referring to FIG. 2, the communication module 190 includes a memory 210, a CP 220, an RFIC 230, an envelope tracking integrated circuit (ETIC) 240, and a radio frequency front end (RFFE) 250.

The memory 210 may store information, data, and/or various commands required for a control and operation of components of the communication module 190 of the electronic device.

The CP 220 may control communication or may process a digital signal. The CP 220 may control an operation or state of the RFIC 230 and/or RFFE 250. For example, the CP 220 may determine an operation or state of components included in the RFIC 230 and/or RFFE 250, and may generate a command for controlling the operation or the state. The CP 220 may include a protocol stack for performing operations in layers defined in a communication standard. The processor CP 220 may generate and interpret a message, based on a format defined in the standard, thereby interacting with a network. The CP 220 may process a digital/baseband signal. The CP 220 may perform channel encoding/decoding and/or modulation/demodulation.

The CP 220 may provide control to tune the state of the RFIC 230 and/or RFFE 250, based on a modulation scheme and/or a waveform of a transmission signal which is output through at least one antenna of the electronic device 101. The CP 220 may measure a characteristic (e.g., linearity or efficiency) or performance of the RFFE 250 while the RFFE 250 operates. The CP 220 may use a coupling signal received from the RFFE 250 to monitor a real-time power, i.e., an instantaneous power, output from a target frequency channel, and may monitor a real-time power output from an adjacent frequency channel to measure an adjacent channel power ratio and determine signal quality.

The CP 220 may perform modulation/demodulation on a baseband signal and/or an intermediate frequency (IF) signal transmitted from the RFIC 230. For example, the CP 220 may output a signal of a set modulation scheme to the RFIC 230.

The RFIC 230 may perform frequency band conversion of a signal to transmit or receive the signal. For example, the CP 220 may process an analog/IF or RF signal. The CP 220 includes a digital to analog coveter (DAC) 231, a first mixer 233, a first amplifier 235, a second amplifier 237, and a second mixer 239. A signal input from the CP 220 may be transferred to the ETIC 240 through the DAC 231. A modulated signal input from the CP 220 may be carried on a carrier frequency fc and may be output as an RF signal via the first amplifier 235.

The RFFE 250 may amplify an RF signal provided from the RFIC 230 or amplify a signal received through an antenna. The RFFE 250 includes a power amplifier (PA) 251, a low noise amplifier (LNA) 253, a transmission/reception switch 255, a filter 257, and a coupler 259. The PA 251 may amplify the RF signal provided from the RFIC 230. The LNA 253 may be used to amplify a reception signal. The transmission/reception switch 255 may connect a path including the PA 251 to the filter 257 when transmitting a signal, and may connect a path including the LNA 253 to the filter 257 when receiving the signal. The filter 257 may filter a signal in accordance with a frequency band of the signal used in communication. The coupler 259 may be used to monitor, on a real-time basis, an instantaneous power of a transmission signal to be output and to monitor a power of an adjacent channel, by coupling the transmission signal to be output to the antenna.

The ETIC 240 may use a power source applied from a power supply (VBATT) to generate an output voltage to be applied to the PA 251 in order to amplify a signal of the PA 251. The ETIC 240 includes a DC-DC 241 and a linear regulator 243. When the ETIC 240 employs envelope tracking (ET) technology, the power source applied from the power supply VBATT may be converted into a DC power source of a designated voltage through the DC-DC 241 in accordance with a waveform of a transmission signal output through the antenna of the electronic device, and may be transferred to the linear regulator 243 through the line 245.

Upon inputting a signal from the DAC 231 of the RFIC 230, the linear regulator 243 may process a voltage of the applied DC power source to generate an output voltage that follows an envelope waveform, and may apply the voltage to the RFFE 250 along a line 249. The ET technology corresponds to a technology that reduces power consumption by applying an envelope signal of an output voltage of the ETIC 240, which is to be applied to the RFFE 250, to the PA 251. In order to reduce the power consumption caused by an increase in a PAPR of an RF signal, operational efficiency of the PA 251 may be increased.

When an average power tracking (APT) technology, which uses a fixed power supply voltage, is employed, the component of the linear regulator 243 may be omitted in the ETIC 240. The DC-DC 241 may output a DC power source of a designated voltage in accordance with a waveform of a transmission signal to be output through at least one antenna of the electronic device, and may output it to the RFFE 250 via the lines 247 and 249.

Among output voltages applied by the ETIC 240 to the RFFE 250 to amplify an input signal (e.g., an RF signal) of the PA 251, when an output waveform of a transmission signal to be output through an antenna of the electronic device is a first waveform (e.g., a DFT-s-OFDM), a first output voltage Vcc_DFT may be generated by using a first DC power source of the first voltage VBB_DFT as an internal voltage of the ETIC 240. For example, when the output waveform of the transmission signal to be output through the antenna of the electronic device is the first waveform, the ETIC 240 may apply the first DC power source as the internal voltage of the ETIC 240 through the DC-DC 241, and thus, may generate the first output voltage Vcc_DFT for amplifying an input signal and apply it to the PA 251.

Among output voltages applied by the ETIC 240 to the RFFE 250 to amplify an input signal of the PA 251, when an output waveform of a transmission signal to be transmitted through an antenna of the electronic device is a second waveform (e.g., a CP-OFDM), a second output voltage Vcc_CP may be generated by using a second DC power source of the second voltage VBB_CP as the internal voltage of the ETIC 240. When the output waveform of the transmission signal to be transmitted through the antenna of the electronic device is the second waveform, the ETIC 240 may apply the second DC power source as the internal voltage of the ETIC 240 through the DC-DC 241, and thus, may generate the second output voltage Vcc_CP for amplifying an input signal of the PA 251 and apply it to the PA 251.

For example, the second voltage VBB_CP may be a value obtained by applying a shift value or offset value designated for the first voltage VBB_DFT.

In order to adjust the voltage of the internal applied voltage for the operation of the ETIC 240 in accordance with the output waveform and/or modulation scheme of the transmission signal to be transmitted through the antenna, the ETIC 240 may generate an output voltage by applying a DC power source of a reference voltage VBB_ref configured to amplify a power level corresponding to the output waveform and/or the modulation scheme under the control of the CP 220.

For example, the memory 210 may store a lookup table (LUT) that matches the reference voltage values VBB_ref corresponding to a plurality of respective output power levels for amplifying a signal, in a form as shown in Table 1 below.

TABLE 1

| PWR lvl | Communication standard | | |
|---|---|---|---|
| | 3G | 4G | 5G |
| Power level 1 | LUT#1 | LUT#1 | LUT#1 |
| . . . | . . . | . . . | . . . |
| Power level N | LUT#N | LUT#N | LUT#N |

Referring to Table 1, a designated LUT may be matched and stored for bands managed for respective communication standards in association with respective power levels. For convenience of explanation, an LUT corresponding to a designated band managed in a 5G communication standard is described hereinafter for example. However, the embodiment is not limited thereto, and may also be applied to another band and/or another communication standard.

For example, each LUT may include information for generating a transmission signal output with a corresponding power level, e.g., a PA bias, a digital pre-distortion (DPD) table, and/or a reference voltage VBB_ref.

When the CP 220 has to output the transmission signal with a power level 1, a designated shift value or offset value may be applied, in accordance with the output waveform and/or the modulation scheme, by applying another reference voltage value VBB_ref #3 in another lookup table LUT #3 obtained by shifting the lookup table by a designated number of steps, instead of applying a reference voltage value VBB_ref #1 to be matched by referring to the aforementioned lookup table (e.g., LUT #1) corresponding to the output power level 1 of the transmission signal.

When the CP 220 has to output the transmission signal with the power level 1, a voltage value calculated by a computing formula which applies a shift value or offset value corresponding to the output waveform and/or modulation scheme may be applied to the reference voltage value VBB_ref #1 of a lookup table (e.g., LUT #1) corresponding to the output power level 1 of the transmission signal, in accordance with the output waveform and/or the modulation scheme.

At least one of the aforementioned components may include a mobile industry processor interface (MIPI) for exchanging a signal with the aforementioned at least one other component.

Figure 3:
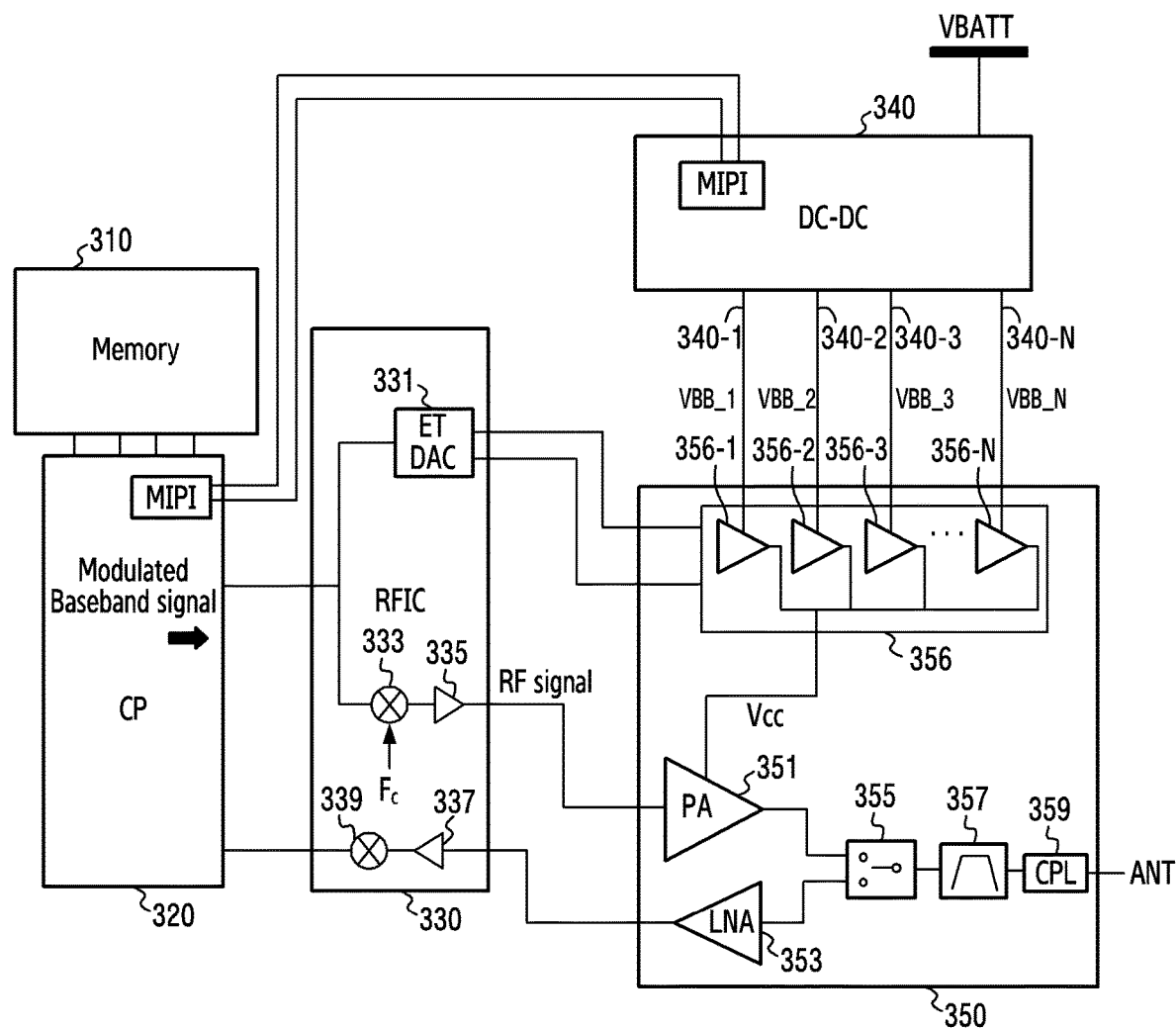
FIG. 3 illustrates a communication module in an electronic device according to an embodiment.

FIG. 3 illustrates a communication module in an electronic device according to an embodiment.

Referring to FIG. 3, the communication module 190 includes a memory 310, a CP 320, an RFIC 330, an ETIC 340, and an RFFE 350.

The memory 310 may store information, data, and/or various commands required for a control and operation of components of the communication module 190 of the electronic device.

The CP 320 may control communication or may process a digital signal. The CP 320 may control an operation or state of an RFIC 330 and/or RFFE 350. The CP 320 may determine an operation or state of components included in the CP 320, the RFIC 330, and/or RFFE 350, and may generate a command for controlling the operation or the state. The CP 320 of FIG. 3 may be similar to the CP 220 of FIG. 2 in terms of a configuration and function thereof, and redundant descriptions will be omitted herein.

The RFIC 330 may perform frequency band conversion of a signal to transmit or receive the signal. The RFIC 330 may process an analog/IF or RF signal. The RFIC 330 includes a DAC 331, a first mixer 333, a first amplifier 335, a second amplifier 337, and a second mixer 339. A signal input from the CP 320 may be transferred to the ETIC 340 through the DAC 331. In addition, a modulated signal input from the CP 320 may be carried on a carrier frequency fc and output as an RF signal via the first amplifier 335.

The ETIC 340 may generate an output voltage for transmission signal amplification by using a power source applied from a power supply VBATT. The ETIC 340 includes a DC-DC. The ETIC 340 may apply a plurality of voltages, i.e., a voltage_1 VBB_1, a voltage_2 VBB_2, a voltage_3 VBB_3, . . . , a voltage_N VBB_N, to the RFFE 350 through a line_1 340-1, a line_2 340-2, a line_3 340-3, . . . , a line_N 340-N by using the power source applied from the power supply VBATT. The plurality of voltages, i.e., the voltage_1 VBB_1, the voltage_2 VBB_2, the voltage_3 VBB_3, . . . , the voltage_N VBB_N, may be different from each other. The plurality of voltages, i.e., the voltage_1 VBB_1, the voltage_2 VBB_2, the voltage_3 VBB_3, . . . , the voltage_N VBB_N, may have different levels (dB), such as 1.5, 3.5, 5.5, . . . or 1~3, 3~5, 5~7 . . . .

Each of the LUTs, i.e., LUT #1, . . . , LUT #N, of Table 1 may include information for generating a transmission signal output with a corresponding power level, e.g., a PA bias, a DPD table, and/or a plurality of reference voltages.

When the processor 320 is to output the transmission signal with the power level 1, voltage values obtained by applying shift values or offset values designated for respective reference voltage values may be applied, in accordance with the output waveform and/or the modulation scheme, by applying another plurality of reference voltage values VBB_ref #3_1, . . . , VBB_ref #3_N in another lookup table LUT #3 obtained by shifting the lookup table by a designated number of steps, instead of applying a plurality of reference voltage values VBB_ref #1_1, . . . , VBB_ref #1_N by referring to the aforementioned lookup table (e.g., LUT #1) corresponding to the output power level 1 of the transmission signal.

When the CP 320 is to output the transmission signal with the power level 1, a plurality of voltage values calculated by applying a shift value or offset value corresponding to the output waveform and/or modulation scheme through a computing formula may be applied to the plurality of reference voltage values VBB_ref #1_1, . . . , VBB_ref #1_N of a lookup table (e.g., LUT #1) corresponding to the output power level 1 of the transmission signal, in accordance with the output waveform and/or the modulation scheme.

When the output waveform of the transmission signal of the electronic device is a first waveform (e.g., a DFT-s-OFDM), the ETIC 340 may use a power source applied from a power supply VBATT to apply the first DC power source that is at least one of a plurality of voltages, i.e., a first voltage_1 VBB_DFT_1, a first voltage_2 VBB_DFT_2, a first voltage_3 VBB_DFT_3, . . . , a first voltage voltage_N VBB_DFT_N, to the RFFE 350 through the line_1 340-1, the line_2 340-2, the line_3 340-3, . . . , the line_N 340-N.

When the output waveform of the transmission signal of the electronic device is a second waveform (e.g., a CP-OFDM), the ETIC 340 may use the power source applied from the power supply VBATT to apply the second DC power source that is at least one of a plurality of voltages, i.e., a second voltage_1 VBB_CP_1, a second voltage_2 VBB_CP_2, a second voltage_CP_3 VBB_3, . . . , a second voltage_N VBB_CP_N, to the RFFE 350 through the line_1 340-1, the line_2 340-2, the line_3 340-3, . . . , the line N 340-N.

The second voltage_1 VBB_CP_1, the second voltage_2 VBB_CP_2, the second voltage_CP_3 VBB_3, . . . , the second voltage_N VBB_CP_N may be values obtained by applying shift values or offset values designated respectively for the first voltage_1 VBB_DFT_1, the first voltage_2 VBB_DFT_2, the first voltage_3 VBB_DFT_3, . . . , the first voltage voltage_N VBB_DFT_N.

The RFFE 350 may amplify an RF signal provided from the RFIC 330 or amplify a signal received through an antenna. The RFFE 350 includes a PA 351, an LNA 353, a transmission/reception switch 355, linear regulators 356, a filter 357, and a coupler 359. The linear regulators 356 may use at least one of the voltage_1 VBB_1, the voltage_2 VBB_2, the voltage_3 VBB_3, . . . , the voltage_N VBB_N applied to the RFFE 350 through the line_1 340-1, the line_2 340-2, the line_3 340-3, . . . , the line_N 340-N to generate an output voltage Vcc and may transfer it to the PA 351. The linear regulators 356 include a first linear regulator 356-1, a second linear regulator 356-2, a third linear regulator 356-3, . . . , an N-th linear regulator 356-N. The PA 351 may use the output voltage Vcc transferred from the linear regulators 356 to amplify an RF signal to be input from the RFIC 330. The LNA 353 may be used to amplify a reception signal. The transmission/reception switch 355 may connect a path including the PA 351 to the filter 357 when transmitting a signal, and may connect a path including the LNA 353 to the filter 357 when receiving the signal. The filter 357 may filter a signal in accordance with a frequency band of the signal used in communication. The coupler 359 may be used to monitor, on a real-time basis, an instantaneous power of a transmission signal to be output and to monitor a power of an adjacent channel, by coupling the transmission signal.

At least one of the aforementioned components may include a MIPI for exchanging a signal with the aforementioned at least one other component.

According to an embodiment, an electronic device may include a PA configured to amplify an input signal; a voltage generator that generates one or more output voltages to be applied to the PA to amplify the input signal; an antenna that outputs a transmission signal, based on a signal amplified by the PA; and a processor (e.g., a CP) that controls the PA and the voltage generator.

The CP may determine whether an output waveform of the transmission signal which is output through the antenna is a first waveform (e.g., a DFT-s-OFDM) or a second waveform (e.g., a CP-OFDM). If the output waveform is the first waveform, the voltage generator may be allowed to generate a first output voltage (e.g., Vcc_DFT) for amplifying the first waveform by applying a first DC power source of one or more first voltages (e.g., VBB_DFT). If the output waveform is the second waveform, the voltage generator may be allowed to generate a second output voltage (e.g., VCC_CP) for amplifying the second waveform by applying a second DC power source of a second voltage (e.g., VBB_CP) shifted by a designated level with respect to the first voltage, based on a peak power of the first waveform and a peak power of the second waveform.

The electronic device may further include a memory that stores an LUT including a list of the plurality of first voltage values applied respectively in association with a plurality of target power levels for amplifying the input signal.

The LUT may include a first LUT including the first voltage stored in association with a first power level. The second voltage may be obtained from a second LUT stored in association with a second power level shifted within the LUT, based on a peak power difference between the first waveform and the second waveform.

The second voltage may be calculated by applying a shift value depending on a power and voltage ratio with respect to the first voltage, based on a peak power difference between the first waveform and the second waveform.

The CP may determine a modulation scheme of the transmission signal to be transmitted through the antenna. If the modulation scheme corresponds to a reference modulation scheme, the first output voltage or the second output voltage may be generated by applying one of the first voltage and the second voltage in accordance with the output waveform of the transmission signal.

If the modulation scheme is not the reference modulation scheme, the CP may apply a voltage calculated by applying a shift value designated for one of the first voltage and the second voltage, applied in accordance with the output waveform, based on a peak power difference between the modulation scheme and the reference modulation scheme.

The electronic device may further include a memory that stores an LUT including a list of the plurality of first voltage values applied respectively in association with a plurality of target power levels for amplifying the input signal. The LUT may include a first LUT including the first voltage stored in association with a first power level and a second LUT including the second voltage in association with a second power level shifted within the LUT based on the peak power difference between the first waveform and the second waveform. If the modulation scheme is not the reference modulation scheme, a third voltage in accordance with the modulation scheme may be obtained from a third LUT shifted from the first LUT or the second LUT, based on the peak power difference between the modulation scheme and the reference modulation scheme.

The CP may monitor a power of the transmission signal by coupling the transmission signal. If an instantaneous power of the transmission signal calculated based on the monitoring is increased or decreased to be greater than or equal to a designated level, the first output voltage or the second output voltage may be generated by applying a third voltage shifted by the designated level with respect to one of the first voltage and the second voltage.

The CP may obtain information on an output waveform of the transmission signal from a control signal received from a base station.

According to an embodiment, an electronic device may include a PA configured to amplify an input signal; a voltage generator (e.g., the voltage generator 240 of FIG. 2 or the voltage generator 340 of FIG. 3) which generates one or more output voltages to be applied to the PA to amplify the input signal; and a CP which controls the PA and the voltage generator. For example, the CP may identify a modulation scheme of the input signal. If the modulation scheme is a reference modulation scheme, the voltage generator may be allowed to generate a reference output voltage for amplifying the input signal by applying a reference DC power source of one or more reference voltage. If the modulation scheme is not the reference modulation scheme, the voltage generator may be allowed to generate an output voltage for amplifying the input signal by applying a DC power source of a voltage shifted by a designated level, based on a peak power of the modulation scheme and a peak power of the reference modulation scheme.

The output waveform may include a DFT-s-OFDM or CP-OFDM output waveform.

Figure 4:
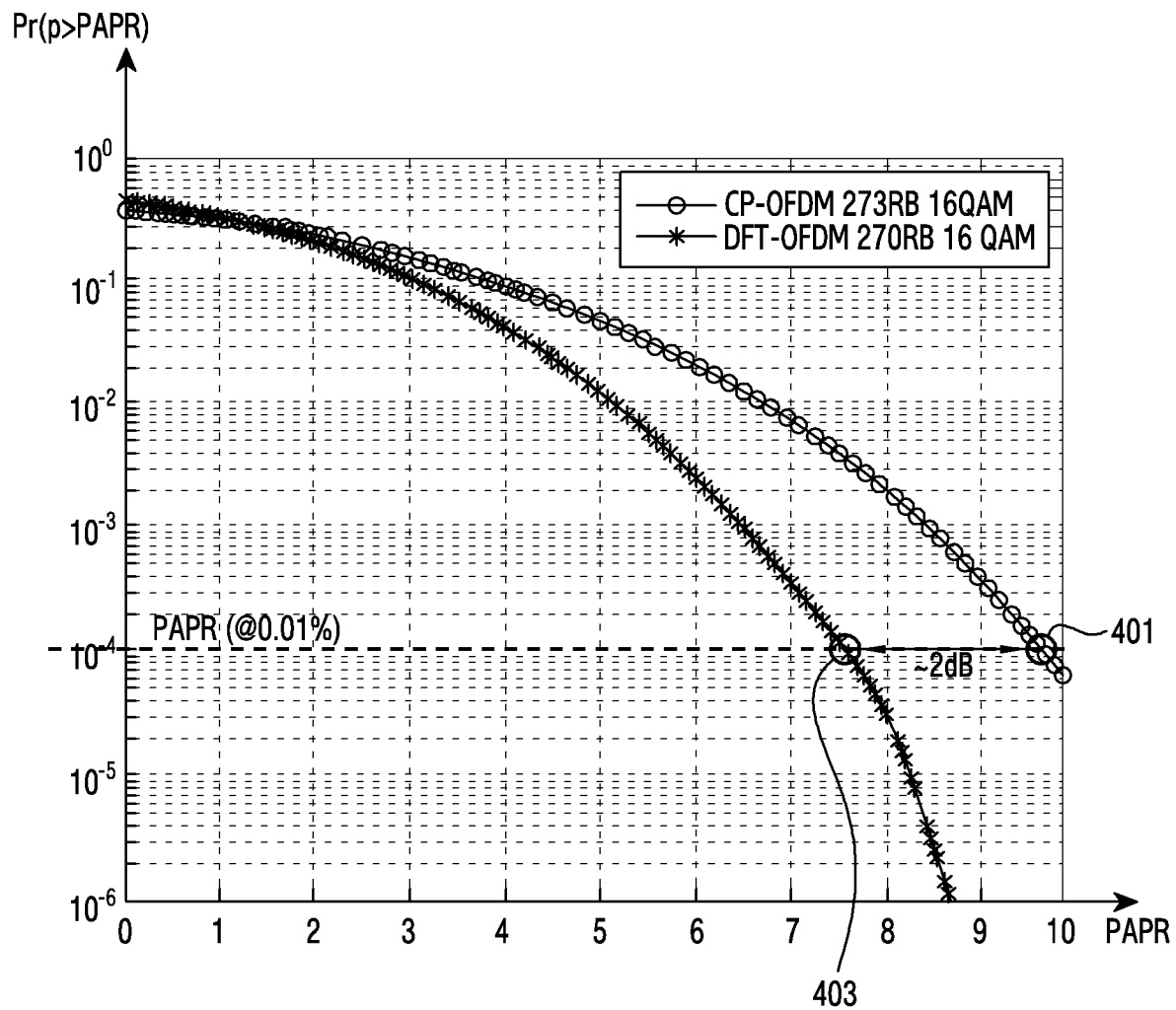
FIG. 4 is a graph illustrating a comparison of peak to average power ratios (PAPRs) based on a waveform of a transmission signal of an electronic device according to an embodiment.

FIG. 4 is a graph illustrating a comparison of PAPRs based on a waveform of a transmission signal of an electronic device according to an embodiment.

In a post Long Term Evolution (LTE) communication network system, several subcarriers are transmitted in an overlapping manner by applying an OFDM technology to increase frequency efficiency. Therefore, a PARP is significantly increased compared to the conventional technique.

An electronic device may transfer an RF signal to a base station through UL communication, and may amplify the signal through a PA so that a sufficient power level is transferred. For example, an APT technology that uses a fixed power supply voltage may consume a great power as heat. ET technology may reduce power consumption of the electronic device, compared to the APT technology. Due to a high PAPR characteristic of OFDM, a DFT-s-OFDM has been developed in LTE to reduce the PAPR. Therefore, the electronic device may use DFT-s-OFDM and a base station may use a CP-OFDM to manage different waveforms. The DFT-s-OFDM has a disadvantage in terms of a resource management of the base station, but has an effect of increasing a power that can be output by the electronic device. The CP-OFDM has an advantage in terms of a resource management of the base station, but has a disadvantage in that the power that can be output by the electronic device is decreased. In 5G UL communication, the electronic device supports both of two types of waveforms, and the base station may adaptively manage an output waveform of the electronic device according to a purpose and a situation.

Regarding the aforementioned two output waveforms, as shown in FIG. 4, a PAPR 401 of the output waveform of the CP OFDM and a PAPR 403 of the output waveform of the DFT-s-OFDM may have a PAPR difference of about 2 dB.

Figures 5A, 5B:
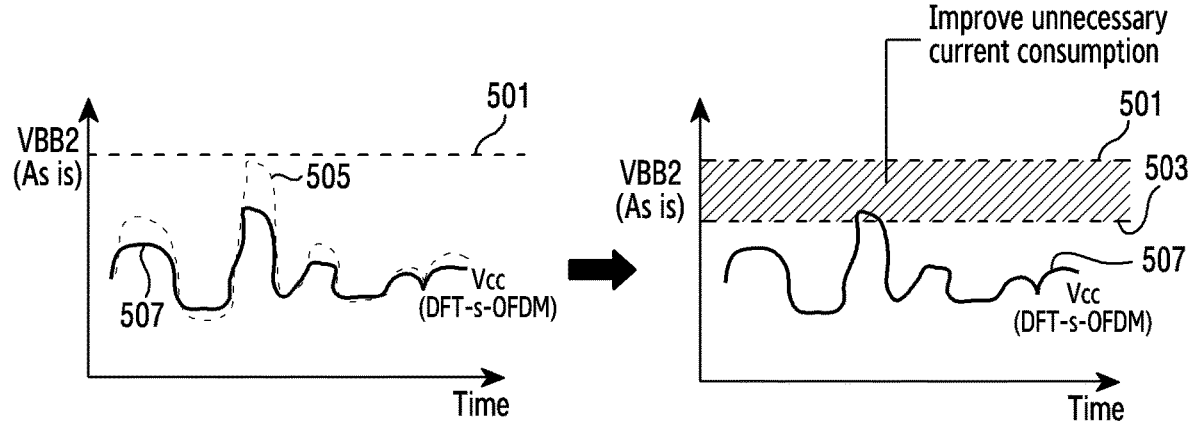
FIG. 5A is a graph illustrating an applied voltage for power amplification based on a waveform of a transmission signal of an electronic device according to an embodiment.
FIG. 5B is a graph illustrating an applied voltage for power amplification based on a waveform of a transmission signal of an electronic device according to an embodiment.

FIG. 5A is a graph illustrating an applied voltage for power amplification based on a waveform of a transmission signal of an electronic device according to an embodiment. FIG. 5B is a graph illustrating an applied voltage for power amplification based on a waveform of a transmission signal of an electronic device according to an embodiment.

Referring to FIG. 5A and FIG. 5B, regarding an output voltage Vcc applied to the PAs 251 or 351 of FIG. 2 or FIG. 3, the voltage levels differ for a Vcc (CP_OFDM) 505 and a Vcc (DFT-s-OFDM) 507 in accordance with a waveform of a transmission signal to be output through an antenna of the electronic device. If an internal applied voltage of an ETIC for generating two types of waveforms is set, e.g., to a second voltage 501 which is a lowest voltage for outputting the Vcc (CP_OFDM) 505, for a DFT-s-OFDM output waveform, current consumption may be increased to an extent corresponding to a difference between the second voltage 501 and a first voltage 503, which is a lowest voltage for outputting the Vcc (DFT-s-OFDM) 507.

For the DFT-s-OFDM output waveform, the lowest voltage for outputting the Vcc (DFT-s-OFDM) 505 may be set to the first voltage 503. Accordingly, for the DFT-s-OFDM output waveform, current consumption may be increased to an extent corresponding to a difference between the second voltage 501 and the first voltage 503, which is the lowest voltage for outputting the Vcc (DFT-s-OFDM) 507.

In For the CP_OFDM output waveform, the lowest voltage for outputting the Vcc (CP_OFDM) 507 may be set to the second voltage 501.

For example, the second voltage 501 for outputting the Vcc (CP_OFDM) 507 may be a value obtained by applying a shift value or offset value of 2 dB, e.g., as shown in FIG. 4, with respect to the first value 503 for outputting the Vcc (DFT-s-OFDM) 505.

Figure 6:
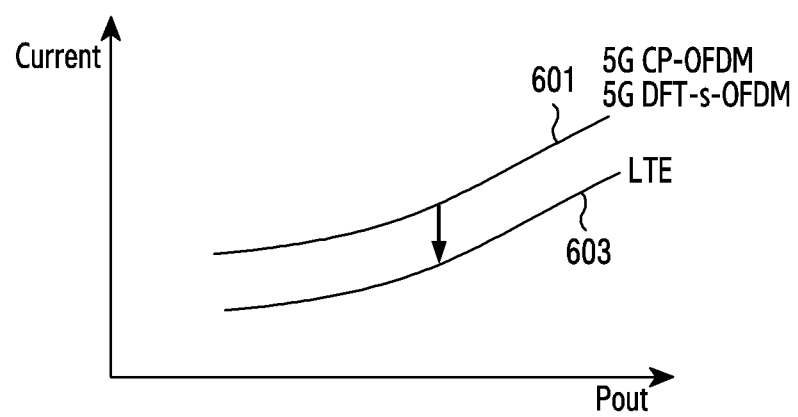
FIG. 6 is a graph illustrating an effect of decreasing power consumption in an electronic device according to an embodiment.

FIG. 6 is a graph illustrating an effect of decreasing power consumption in an electronic device according to an embodiment.

Referring to FIG. 6, unlike the CP-OFDM output waveform in 5G, the DFT-s-OFDM output waveform may be used to amplify an output of a transmission signal when performing a UL operation. In this case, turning of an ETIC (e.g., the ETIC 240 of FIG. 2 or the ETIC 340 of FIG. 3) may be performed differently so that a first output voltage Vcc_DFT is generated by applying an applied voltage of the ETICs 240 and 340 for amplifying the transmission signal for the DFT-s-OFDM output waveform to the first voltage VBB_DFT, and the first output voltage Vcc_DFT is used to amplify an output power of an RF signal by using a PA. Accordingly, when current and power values are compared based on an envelope peak value consumed by DC power source of the first voltage VBB_DFT as an applied voltage which is set for the DFT-s-OFDM output waveform, as illustrated in FIG. 6, an efficiency and power consumption 603 that can be obtained in the 5G DFT-s-OFDM UL scheme is similar to that of LTE instead of a power consumption 601 of the conventional technique.

Figure 7:
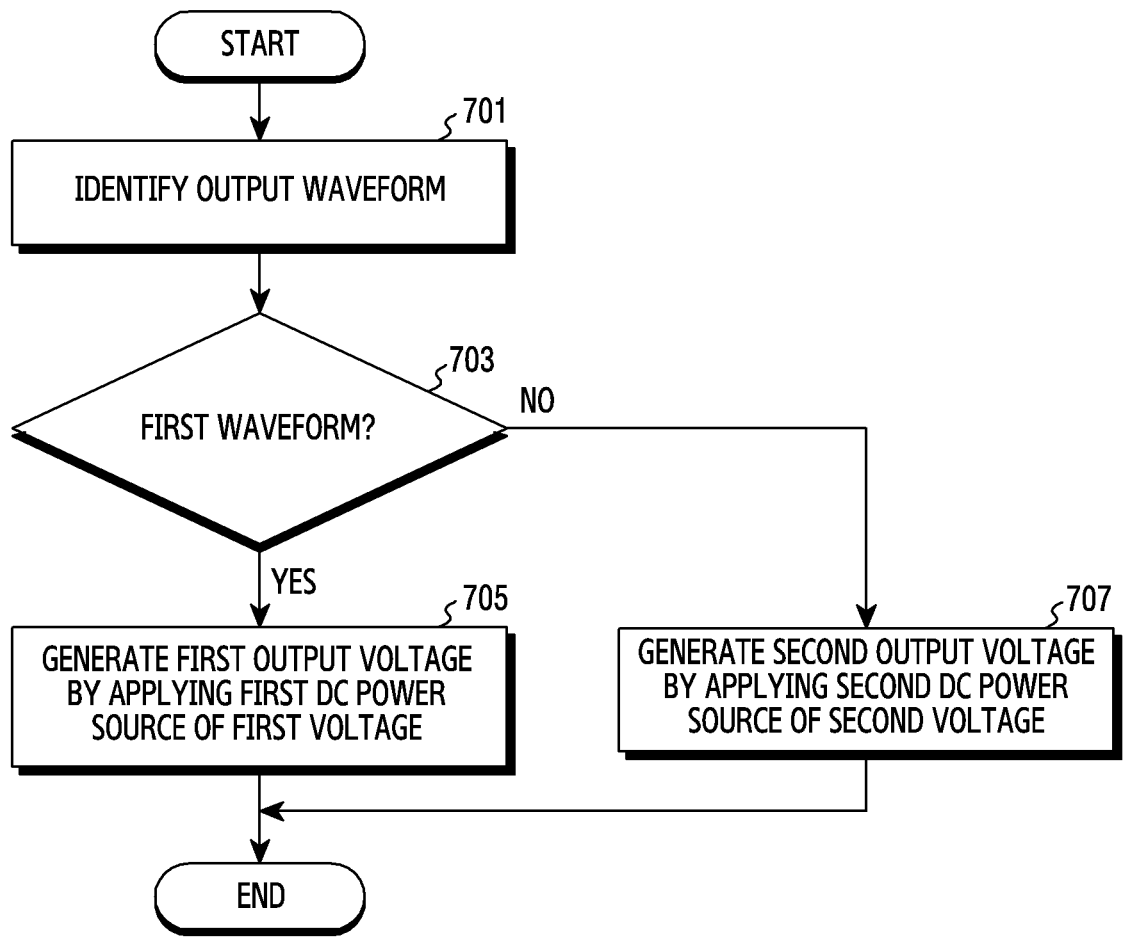
FIG. 7 is a flowchart illustrating an operation for adjusting an applied voltage for power amplification of a transmission signal, based on an output waveform of an electronic device, according to an embodiment.

FIG. 7 is a flowchart illustrating an operation for adjusting an applied voltage for power amplification of a transmission signal, based on an output waveform of an electronic device, according to an embodiment.

Referring to FIG. 7, a processor (e.g., a CP) of an electronic device may adjust an applied voltage, in accordance with an output waveform of a transmission signal of the electronic device.

In step 701, the processor identifies the output waveform of the transmission signal through a control signal transmitted from a base station. The output waveform of the transmission signal may be a first waveform (e.g., a DFT-s-OFDM) or a second waveform (e.g., CP-OFDM), and may be configured by the base station and may be received in the electronic device through the control signal.

In step 703, the processor determines if the output waveform is the first waveform, in order to amplify an input signal (an RF signal) to be input to a PA, and if the output waveform is the first waveform, the processor generates a first output voltage Vcc_DFT for amplifying the input signal by using a first DC power source of a first voltage VBB_DFT in step 705.

For example, if the output waveform is the first waveform, referring to Table 1 above, the first voltage VBB_DFT for amplifying the input signal may be obtained from a lookup table corresponding to a target output power level of a transmission signal. If the target output power level of the transmission signal is 2, the first voltage VBB_DFT may be obtained as a reference voltage VBB_ref #1 obtained from a corresponding lookup table LUT #2.

If it is determined that the output waveform is not the first waveform in step 703, the processor generates a second output voltage Vcc_CP for amplifying the input signal by using a second DC power source of a second voltage VBB_CP in step 707.

For example, if the output waveform is the second waveform, referring to Table 1 above, the second voltage VBB_CP may be obtained from a lookup table (e.g., LUT #3) shifted by a designated power level step, other than a lookup table (e.g., LUT #1) corresponding to the target output power level of the transmission signal. If the target output power level of the transmission signal is 2, the second voltage VBB_CP may be obtained from another lookup table LUT #4 shifted by a designated power level step, other than a corresponding lookup table LUT #2. If the power level steps of the lookup tables are different from each other by about 1 dB, a to-be-shifted level step of the lookup table may be set to, e.g., 2 steps, when a difference between a maximum value of a target output level of the transmission signal of the DFT-s-OFDM waveform and a maximum value of a target output level of the transmission signal of the CP-OFDM waveform or a difference between a PAPR of the transmission signal of the DFT-s-OFDM waveform and a PAPR of the transmission signal of the CP-OFDM waveform is about 2 dB.

Referring to Table 1 above, the second voltage VBB_CP for amplifying the input signal to output a transmission signal of a second waveform may be a value obtained by applying a shift value or offset value designated for the voltage obtained from the lookup table (e.g., LUT #1) corresponding to the target output power level of the transmission signal (e.g., the first voltage VBB_DFT obtained through the reference voltage VBB_ref #1).

The designated shift value or offset value may be calculated through an expression of a power and voltage relationship as shown in Equation (1) below.

$$VBB_{CP} = VBB_{DFT} \times \sqrt{10^{\left(\frac{x}{10}\right)}} \quad (1)$$

In Equation (1), x denotes a difference of a power level of a CP-OFDM scheme which shows a difference of about 2 dB with respect to the DFT-s-OFDM scheme. A designated shift value $$\sqrt{10^{\left(\frac{2}{10}\right)}}$$

may be multiplied by the first voltage VBB-DFT, to which the reference voltage VBB_ref #1 of the lookup table LUT #1 is applied, according to Equation (1) above, to calculate the second voltage VBB_CP of the CP-OFDM scheme that shows a difference of about 2 dB with respect to the DFT-s-OFDM scheme. If the power level is N, $$\sqrt{10^{\left(\frac{2}{10}\right)}}$$

may be multiplied by first voltage VBB_DFT, to which the reference voltage VBB_ref #N of the lookup table LUT #N corresponding to the power level N is applied, to calculate the second voltage VBB_CP.

Figure 8:
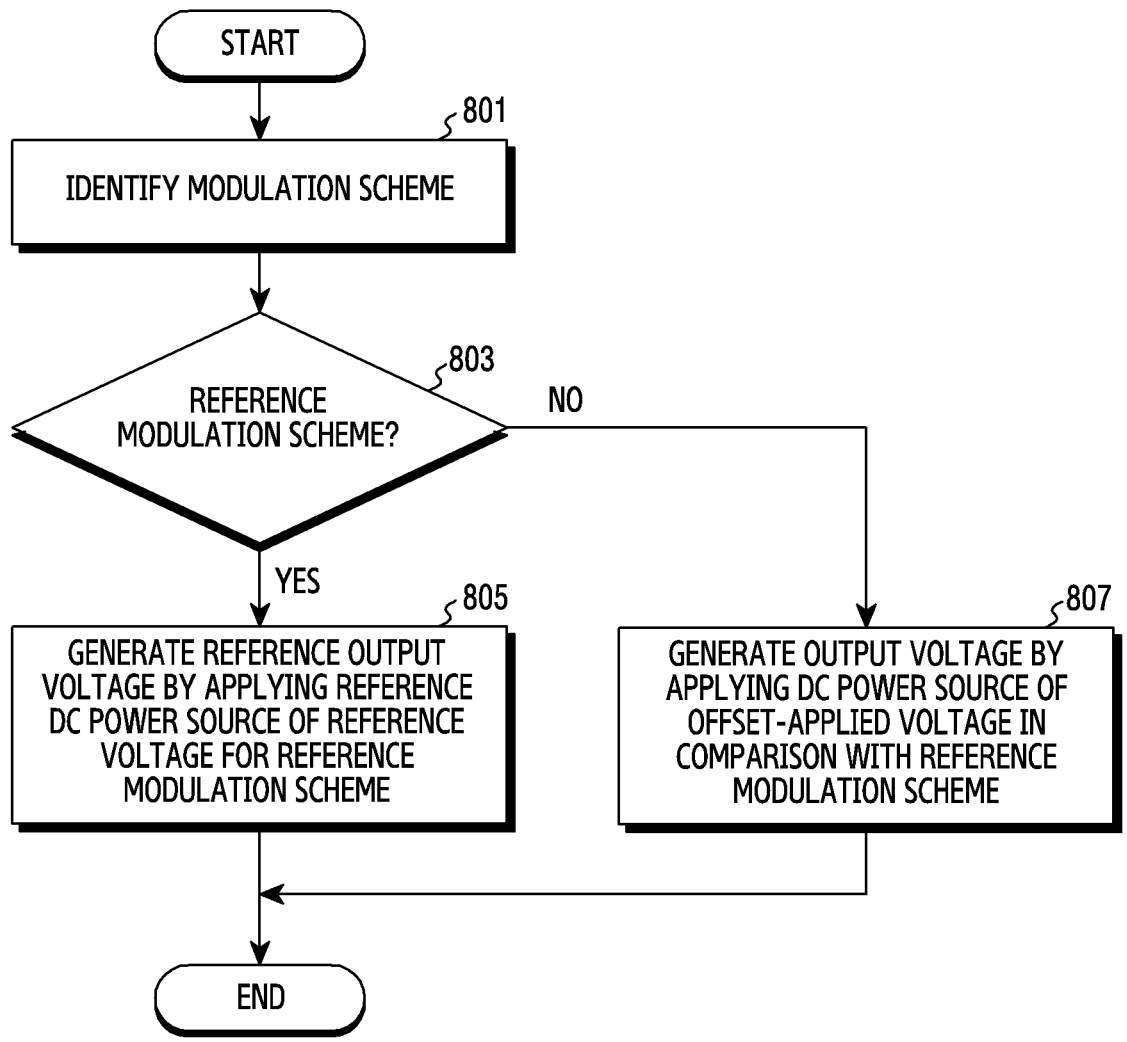
FIG. 8 is a flowchart illustrating an operation for adjusting an applied voltage for power amplification of a transmission signal, based on a modulation scheme of an electronic device, according to an embodiment.

FIG. 8 is a flowchart illustrating an operation for adjusting an applied voltage for power amplification of a transmission signal, based on a modulation scheme of an electronic device, according to an embodiment.

Referring to FIG. 8, a processor may adjust an applied voltage, based on a modulation scheme of a transmission signal transmitted through an antenna of the electronic device.

In step 801, the processor identifies the modulation scheme of the transmission signal through a control signal transmitted from a base station. The modulation scheme of the transmission signal may include a quadrature phase shift keying (QPSK), 16-quadrature amplitude modulation (QAM), 64QAM, or 256QAM scheme.

In step 803, the processor determines if the modulation scheme is a reference modulation scheme, and if it is, the processor generates an output voltage to be applied to a PA to amplify an input signal of the PA by using a DC power source of a reference voltage VBB_ref to amplify an input signal of the PA in step 805, based on the modulation scheme. For example, the reference modulation scheme may be set to the QPSK having a low code rate.

For example, referring to Table 1 above, the reference voltage VBB_ref for amplifying a transmission signal modulated through the QPSK, which is the reference modulation scheme, may obtain a lookup table corresponding to a target output power level of the transmission signal. If the target output power level of the transmission signal is 2, the reference voltage VBB_ref #2 to be matched may be obtained from a corresponding lookup table LUT #2.

If the processor determines in step 803 that the modulation scheme is not the reference modulation scheme, the processor compares the reference modulation scheme and the modulation scheme and generates an output voltage to be applied to a PA to amplify an input signal of the PA by using a reference voltage of a lookup table corresponding to a power level shifted by a designated power level from the lookup table corresponding to the target output power level of the transmission signal in step 807.

For example, if it is not the reference modulation scheme, referring to Table 1 above, an applied voltage used to generate an output voltage applied to the PA in order to amplify an input signal of the PA may be obtained from a lookup table (e.g., LUT #2) shifted by a designated power level step, other than a lookup table (e.g., LUT #1) corresponding to the target output power level of the transmission signal. If the target output power level of the transmission signal is 1, the reference voltage VBB_ref #2 obtained from the lookup table LUT #2 shifted by a designated power level step other than the corresponding lookup table LUT #1 may be applied as the applied voltage for amplifying the input signal. If the power level steps of the lookup tables are different from each other by about 1 dB, a reference value of a lookup table shifted by an output power level 1 with respect to a lookup table based on the reference modulation scheme (e.g., QPSK) may be applied for each of modulation schemes when a level difference of envelope peak values of output signals between the modulation scheme, e.g., QPSK, 16QAM, 64QAM, or 256QAM, is about 1 dB. When the QPSK is set to the reference modulation scheme, if the modulation scheme is 16QAM, the reference voltage VBB_ref #2 of the lookup table LUT #2 shifted by 1 step with respect to the lookup table LUT #1 corresponding to the output power level 1 may be applied as the applied voltage for amplifying the transmission signal. When the QPSK is set to the reference modulation scheme, if the modulation scheme is 64QAM, the reference voltage VBB_ref #3 of the lookup table LUT #3 shifted by 2 steps with respect to the lookup table LUT #1 corresponding to the output power level 1 may be applied as the applied voltage for amplifying the transmission signal. When the QPSK is set to the reference modulation scheme, if the modulation scheme is 250QAM, the reference voltage VBB_ref #4 of the lookup table LUT #4 shifted by 3 steps with respect to the lookup table LUT #1 corresponding to the output power level 1 may be applied as the applied voltage for amplifying the transmission signal.

If the identified modulation scheme is not the reference modulation scheme, referring to Table 1 above, an applied voltage for generating an output voltage applied to the PA in order to amplify an input signal of the PA may be a value obtained by applying a shift value or offset value designated for the voltage obtained from the lookup table (e.g., LUT #1) corresponding to the target output power level of the transmission signal.

The designated shift value or offset value may be calculated through the expression of the power and voltage relationship as shown in Equation (1) described above.

When the 16QAM scheme shows a difference of about 1 dB with respect to the QPSK, a designated shift value $$\sqrt{10^{\left(\frac{1}{10}\right)}}$$

may be multiplied by the reference voltage VBB_ref of the QPSK which is the reference modulation scheme, according to Equation (1) above, to calculate an applied voltage of the 16QAM scheme. When the 64QAM scheme shows a difference of about 2 dB with respect to the QPSK, a designated shift value $$\sqrt{10^{\left(\frac{2}{10}\right)}}$$

may be multiplied by the reference voltage VBB_ref of the QPSK, according to the equation (1) above, to calculate an applied voltage of the 64QAM scheme. When the 256QAM scheme shows a difference of about 3 dB with respect to the QPSK, a designated shift value $$\sqrt{10^{\left(\frac{3}{10}\right)}}$$

may be multiplied by the reference voltage VBB_ref of the QPSK, according to Equation (1) above, to calculate an applied voltage of the 256QAM scheme.

Figure 9:
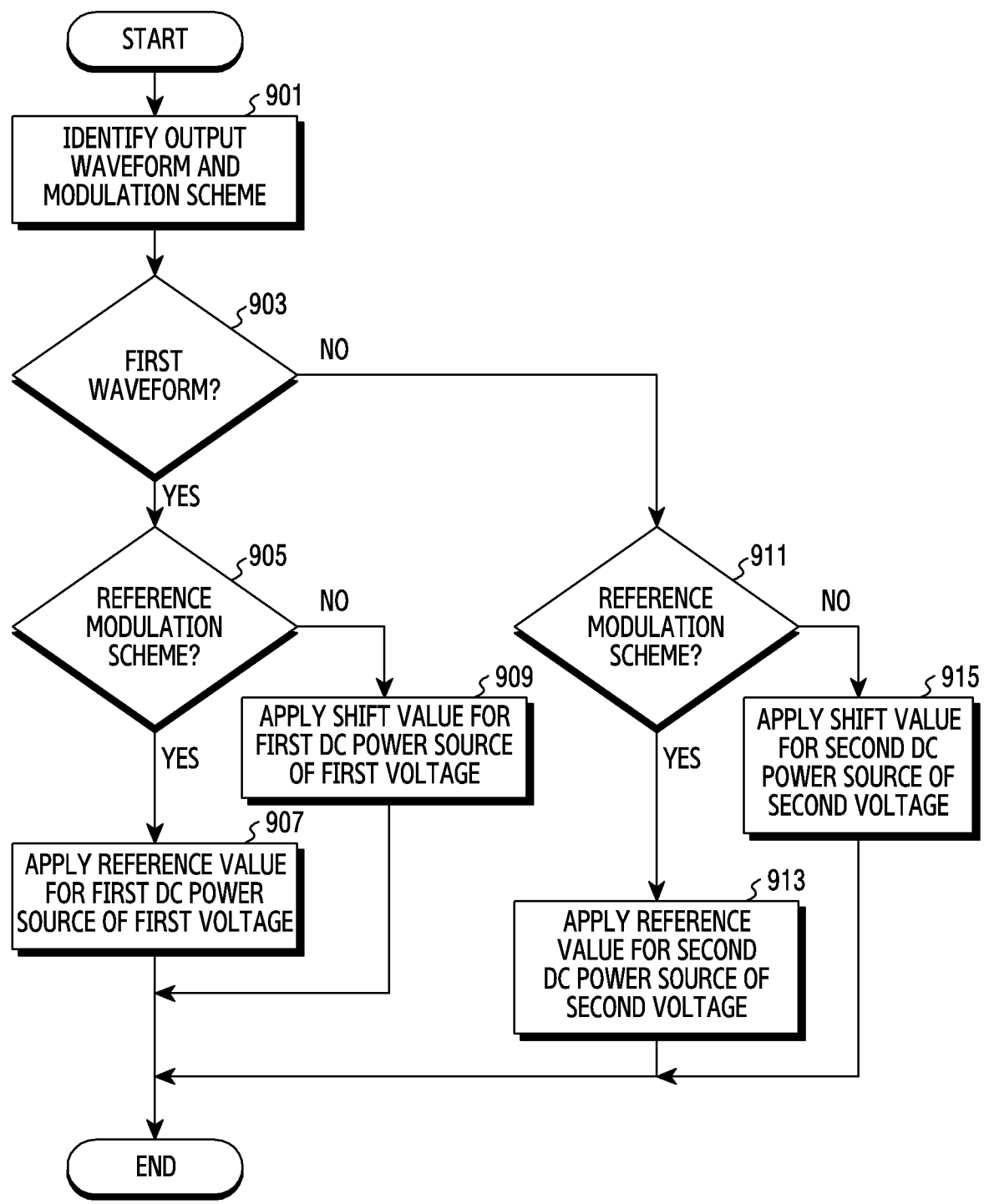
FIG. 9 is a flowchart illustrating an operation for adjusting an applied voltage for power amplification of a transmission signal, based on an output waveform and modulation scheme of an electronic device, according to an embodiment.

FIG. 9 is a flowchart illustrating an operation for adjusting an applied voltage for power amplification of a transmission signal, based on an output waveform and modulation scheme of an electronic device, according to an embodiment.

Referring to FIG. 9, in step 901, a processor (e.g., a CP) of an electronic device identifies an output waveform and modulation scheme of a transmission signal of the electronic device.

For example, the processor may identify the output waveform and/or modulation scheme of the transmission signal through a control signal transmitted from a base station. The output waveform of the transmission signal may be a first waveform (e.g., a DFT-s-OFDM) or a second waveform (e.g., a CP-OFDM), and may be configured by the base station and may be received in the electronic device through the control signal.

If it is identified in step 903 that the output waveform is the first waveform, the processor identifies whether the modulation scheme of the transmission signal is the reference modulation scheme in step 905.

If the modulation scheme is the reference modulation scheme in step 905, the processor generates a first output voltage Vcc_DFT for amplifying the transmission signal of the electronic device by using a first DC power source of a first voltage VBB_DFT of a reference voltage of the reference modulation scheme of a first waveform to amplify a PA input signal in step 907. For example, the reference modulation scheme may be set to QPSK having a low code rate.

Referring to Table 1 above, the first voltage VBB_DFT, which is a reference voltage for amplifying a transmission signal modulated with the QPSK, which is a reference modulation scheme of a first waveform, may be obtained from a lookup table corresponding to a target output power level of the transmission signal.

If it is identified in step 905 that the modulation scheme is not the reference modulation scheme, the processor compares the reference modulation scheme and the modulation scheme and generates an output voltage for amplifying the transmission signal of the electronic device by using a reference voltage VBB_ref of a lookup table corresponding to a power level shifted by a designated power level from the lookup table corresponding to the target output power level of the transmission signal in step 909. For example, if the output waveform corresponds to a first waveform but the modulation scheme is a 16QAM modulation scheme, referring to Table 1 above, the applied voltage for amplifying the transmission signal may be obtained from a lookup table (e.g., LUT #2) shifted by a designated power level step (e.g., 1 step), other than the lookup table (e.g., LUT #1) corresponding to the target output power level of the transmission signal.

If it is identified in step 903 that the output waveform is not the first waveform, e.g., the output waveform is a second waveform, the processor identifies whether the second waveform is the reference modulation scheme in step 909.

If it is identified in step 911 that the modulation scheme of the transmission signal is the reference modulation scheme, the processor applies a second DC power source of the second voltage VBB_CP for the second waveform as a reference voltage value of the reference modulation scheme in step 913. For example, if the modulation scheme is the reference modulation scheme, the second output voltage Vcc_CP for amplifying the transmission signal of the electronic device may be generated by using the second DC power source of the second voltage VBB_CP, which is an applied voltage of the second waveform to amplify a PA input signal. The reference modulation scheme may be set to QPSK having a low code rate.

Referring to Table 1 above, the second voltage VBB_CP, which is the reference voltage for amplifying the PA input signal modulated with the QPSK, which is the reference modulation scheme of the second waveform may be obtained, e.g., from the lookup table (e.g., LUT #3) shifted by 2 steps from the lookup table (e.g., LUT #1) corresponding to the target output power level (e.g., the power level 1) of the transmission signal.

If it is identified in step 911 that the modulation scheme is not the reference modulation scheme, the processor applies a value shifted by a designated shift value to the second DC power source of the second voltage VBB_CP by comparing the modulation scheme with the reference modulation scheme in step 915.

From the lookup table (e.g., LUT #3) shifted (e.g., 2 steps) in accordance with the target output power level (e.g., the level 1) of the transmission signal of the second waveform in order to amplify the PA input signal, the second output voltage Vcc_CP for amplifying the transmission signal of the electronic device may be generated by applying the reference voltage VBB_ref #4 of the lookup table (e.g., LUT #4) corresponding to the power level shifted by the designated power level (e.g., 1 step) based on the comparison between the modulation scheme and the reference modulation scheme.

Referring to Table 1 above, the applied voltage for amplifying the transmission signal of, e.g., the 16QAM modulation scheme, other than the reference modulation scheme, may be obtained from the lookup table (e.g., LUT #4) shifted by a designated power level step (e.g., 3 steps), other than the lookup table (e.g., LUT #1) corresponding to the target output power level of the transmission signal.

Figure 10:
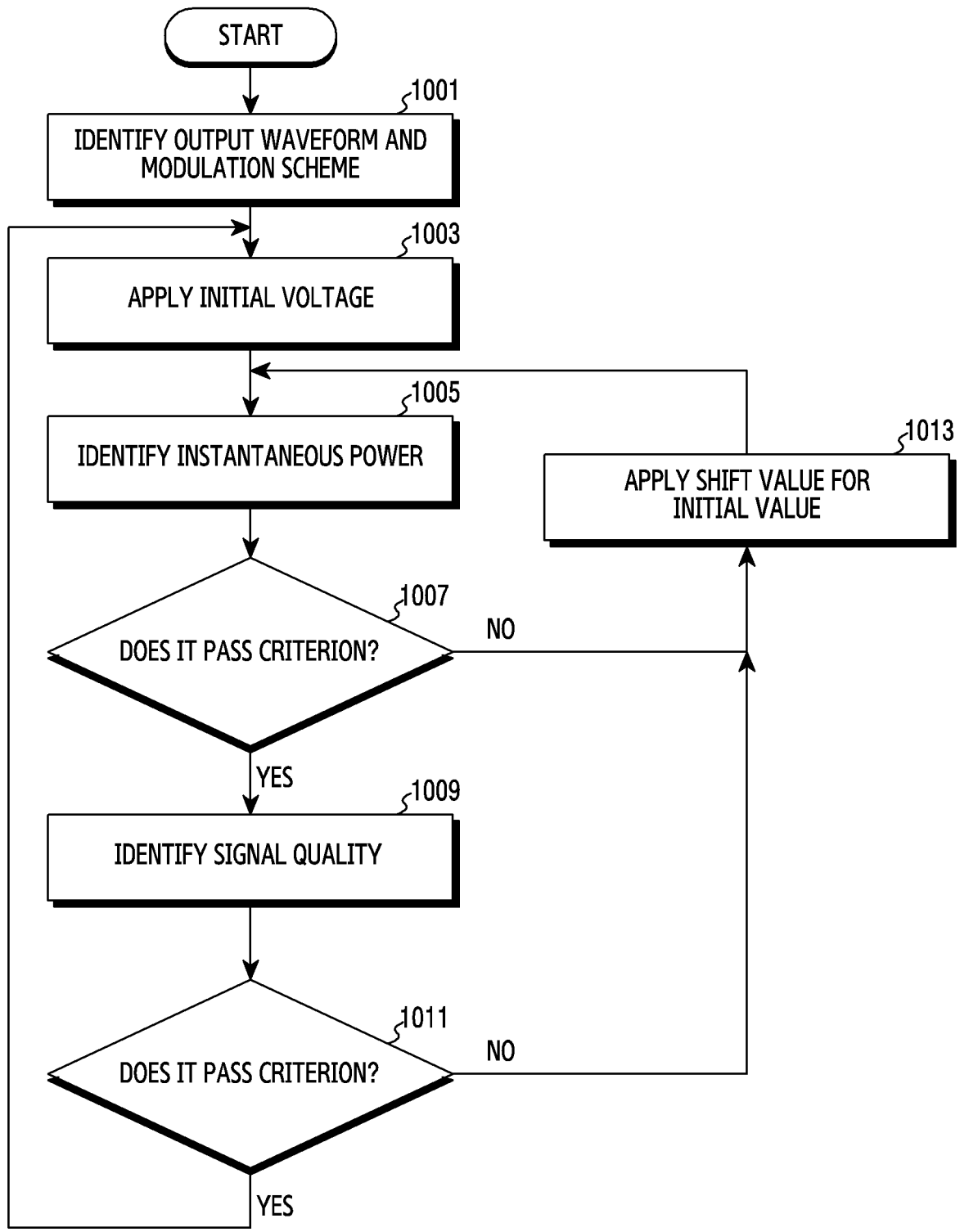
FIG. 10 is a flowchart illustrating an operation for adaptively re-adjusting an applied voltage for power amplification of a transmission signal adjusted based on an output waveform and/or modulation scheme of an electronic device, in accordance with an instantaneous power and/or signal quality, according to an embodiment.

FIG. 10 is a flowchart illustrating an operation for adaptively re-adjusting an applied voltage for power amplification of a transmission signal adjusted based on an output waveform and/or modulation scheme of an electronic device, in accordance with an instantaneous power and/or signal quality, according to an embodiment.

Referring to FIG. 10, in step 1001, a processor (e.g., a CP) of an electronic device identifies an output waveform and/or modulation scheme of a transmission signal of the electronic device.

In step 1003, the processor determines and applies an initial applied voltage used to amplify power of an input signal of a PA, in accordance with the output waveform and/or the modulation scheme. Since the initial applied voltage determined in accordance with the output waveform and/or modulation scheme is described in detail in the aforementioned examples, details thereof will be omitted herein.

In step 1005, the processor monitors through a power feedback to obtain a power value in a current channel of the transmission signal, thereby identifying an instantaneous power. For example, the processor may monitor power of a transmission signal to be output, through a power feedback by coupling the transmission signal to be output through a coupler of an RFFE.

If the instantaneous power increases or decreases beyond a set reference level (e.g., about 1 dB), the processor determines that it fails to pass a criterion in step 1007, and applies a voltage value shifted in accordance with the increased or decreased reference level from the aforementioned initial voltage in step 1013. For example, the reference level may be set to a proper value according to a design of the electronic device. If the instantaneous power is increased to be greater than or equal to the reference level, the applied voltage may be changed by applying, e.g., the lookup table (e.g., LUT #2) shifted by 1 step to the lookup table (e.g., LUT #1) applied to the initially applied voltage.

If the instantaneous power is not increased or decreased to be greater than or equal to the set reference level, the processor determines that it passes the criterion in step 1007, and identifies signal quality of the transmission signal in step 1009. For example, the processor may identify signal quality by using an adjacent channel power ratio calculated through comparison between a power value in a current channel of a transmission signal monitored through the aforementioned power feedback with a power value in an adjacent channel.

If the signal quality of the transmission signal is improved or degraded to be greater than, for example, a designated reference level, the processor determines that it fails to pass a criterion in step 1011, and changes an applied voltage by applying a voltage value shifted in accordance with the improved or degraded signal quality from the aforementioned initially applied voltage ins step 1013. For example, if the signal quality is degraded to be greater than or equal to the reference level, the applied voltage may be changed by applying, for example, the lookup table (e.g., LUT #2) shifted by 1 step to the lookup table (e.g., LUT #1) applied to the initially applied voltage.

If the signal quality is not improved or degraded to be greater than or equal to the reference level, the processor determines that it passes the criterion in step 1011, and maintains and applies the initially applied voltage.

As described above, a method is provided for adjusting an applied voltage for transmission signal amplification and an electronic device thereof, which can decrease current consumption by adaptively adjusting a management of the voltage for transmission signal amplification, based on different waveforms and/or modulation schemes. Accordingly, heat generation of the electronic device can also be decreased.

A method is also provided for adjusting an applied voltage for transmission signal amplification and an electronic device thereof, which can decrease current consumption by adaptively adjusting a management of the voltage for transmission signal amplification, based on different waveforms and/or modulation schemes.

A method is also provided for adjusting an applied voltage for transmission signal amplification and an electronic device thereof, which can decrease current consumption by adaptively adjusting a voltage management, in accordance with an instantaneous power and/or signal quality of a transmission signal.

While the disclosure has been particularly shown and described with reference to certain embodiments thereof, it will be understood by those of ordinary skill in the art that various changes in form and details may be made therein without departing from the spirit and scope of the disclosure as defined by the following claims and their equivalents.

What is claimed is:

1. An electronic device, comprising:
    a power amplifier (PA) configured to amplify an input signal;
    a voltage generator configured to generate one or more output voltages to be applied to the PA to amplify the input signal;
    an antenna configured to output a transmission signal, based on a signal amplified by the PA; and
    a communication processor (CP) configured to control the PA, the voltage generator, and the antenna,
    wherein the CP is configured to:
        determine whether an output waveform of the transmission signal output through the antenna is a first waveform or a second waveform,
        if the output waveform is the first waveform, control the voltage generator to generate a first output voltage for amplifying the first waveform by applying a first direct current (DC) power source of one or more first voltages, and
        if the output waveform is the second waveform, control the voltage generator to generate a second output voltage for amplifying the second waveform by applying a second DC power source of a second voltage shifted by a designated level with respect to the first voltage, based on a peak power of the first waveform and a peak power of the second waveform.

2. The electronic device of claim 1, further comprising a memory configured to store a lookup table (LUT) including a list of the plurality of first voltage values applied respectively in association with a plurality of target power levels for amplifying the input signal.

3. The electronic device of claim 2, wherein the LUT includes a first LUT including the first voltage stored in association with a first power level, and a second LUT stored in association with a second power level shifted within the LUT, based on a peak power difference between the first waveform and the second waveform, and
    wherein the second voltage is obtained from the second LUT.

4. The electronic device of claim 1, wherein the second voltage is calculated by applying a shift value depending on a power and voltage ratio with respect to the first voltage, based on a peak power difference between the first waveform and the second waveform.

5. The electronic device of claim 1, wherein the CP is further configured to:
    determine a modulation scheme of the transmission signal to be transmitted through the antenna, and
    if the modulation scheme corresponds to a reference modulation scheme, control the voltage generator to generate the first output voltage or the second output voltage by applying one of the first voltage and the second voltage in accordance with the output waveform of the transmission signal.

6. The electronic device of claim 5, wherein the CP is further configured to, if the modulation scheme is not the reference modulation scheme, apply a voltage calculated by applying a shift value designated for one of the first voltage and the second voltage, applied in accordance with the output waveform, based on a peak power difference between the modulation scheme and the reference modulation scheme.

7. The electronic device of claim 5, further comprising a memory configured to store a lookup table (LUT) including a list of the plurality of first voltage values applied respectively in association with a plurality of target power levels for amplifying the input signal,
    wherein the LUT includes a first LUT including the first voltage stored in association with a first power level and a second LUT including the second voltage in association with a second power level shifted within the LUT, based on the peak power difference between the first waveform and the second waveform, and
    wherein if the modulation scheme is not the reference modulation scheme, a third voltage in accordance with the modulation scheme is obtained from a third LUT shifted from the first LUT or the second LUT, based on the peak power difference between the modulation scheme and the reference modulation scheme.

8. The electronic device of claim 1, wherein the CP is further configured to:
    monitor a power of the transmission signal by coupling the transmission signal, and
    if an instantaneous power of the transmission signal calculated based on the monitoring is increased or decreased to be greater than or equal to a designated level, generate the first output voltage or the second output voltage by applying a third voltage shifted by the designated level with respect to one of the first voltage and the second voltage.

9. The electronic device of claim 1, wherein the CP is further configured to obtain information on an output waveform of the transmission signal from a control signal received from a base station.

10. The electronic device of claim 1, wherein the output waveform includes a discrete Fourier transform spread orthogonal frequency division multiplexing (DFT-s-OFDM) or cyclic prefix OFDM (CP-OFDM) output waveform.

11. An electronic device, comprising:
    a power amplifier (PA) configured to amplify an input signal;
    a voltage generator configured to generate one or more output voltages to be applied to the PA to amplify the input signal;
    an antenna configured to output a transmission signal, based on a signal amplified by the PA; and
    a communication processor (CP) configured to control the PA, the voltage generator, and the antenna,
    wherein the CP is configured to:
        determine a modulation scheme of the transmission signal output through the antenna, if the modulation scheme is a reference modulation scheme, control the voltage generator to generate a reference output voltage for amplifying the input signal by applying a reference direct current (DC) power source of one or more reference voltage, and if the modulation scheme is not the reference modulation scheme, control the voltage generator to generate an output voltage for amplifying the input signal by applying a DC power source of a voltage shifted by a designated level, based on a peak power of the modulation scheme and a peak power of the reference modulation scheme.

12. A method of controlling an electronic device, the method comprising:

determining whether an output waveform of a transmission signal output through an antenna of the electronic device is a first waveform or a second waveform;

if the output waveform is the first waveform, generating a first output voltage for amplifying an input signal of a power amplifier (PA) of the electronic device, by using a first direct current (DC) power source of one or more first voltages; and if the output waveform is the second waveform, generating a second output voltage for amplifying the second waveform by using a second DC power source of a second voltage shifted by a designated level with respect to the first voltage, based on a peak power of the first waveform and a peak power of the second waveform.

13. The method of claim 12, wherein information on the first voltage is obtained from a memory that stores a lookup table (LUT) including a list of the plurality of first voltage values applied respectively in association with a plurality of target power levels for amplifying the input signal.

14. The method of claim 13, wherein the LUT includes a first LUT including the first voltage stored in association with a first power level, and a second LUT stored in association with a second power level shifted within the LUT, based on a peak power difference between the first waveform and the second waveform, and wherein the second voltage is obtained from the second LUT.

15. The method of claim 12, wherein the second voltage is calculated by applying a shift value depending on a power and voltage ratio with respect to the first voltage, based on a peak power difference between the first waveform and the second waveform.

16. The method of claim 12, further comprising:

determining a modulation scheme of the transmission signal; and if the modulation scheme corresponds to a reference modulation scheme, generating the first output voltage or the second output voltage by applying one of the first voltage and the second voltage in accordance with the output waveform of the transmission signal.

17. The method of claim 16, further comprising, if the modulation scheme is not the reference modulation scheme, applying a voltage calculated by applying a shift value designated for one of the first voltage and the second voltage, applied in accordance with the output waveform, based on a peak power difference between the modulation scheme and the reference modulation scheme.

18. The method of claim 16, further comprising obtaining from a memory a lookup table (LUT) including a list of the plurality of first voltage values applied respectively in association with a plurality of target power levels for amplifying the input signal, wherein the LUT includes a first LUT including the first voltage stored in association with a first power level and a second LUT including the second voltage in association with a second power level shifted within the LUT, based on the peak power difference between the first waveform and the second waveform, and wherein if the modulation scheme is not the reference modulation scheme, a third voltage in accordance with the modulation scheme is obtained from a third LUT shifted from the first LUT or the second LUT, based on the peak power difference between the modulation scheme and the reference modulation scheme.

19. The method of claim 12, further comprising monitoring a power of the transmission signal by coupling the transmission signal, wherein, if an instantaneous power of the transmission signal calculated based on the monitoring is increased or decreased to be greater than or equal to a designated level, the first output voltage or the second output voltage is generated by applying a third voltage shifted by the designated level with respect to one of the first voltage and the second voltage.

20. The method of claim 12, further comprising receiving a control signal including information on an output waveform of the transmission signal from a base station.

* * * * *